US006372077B1

(12) United States Patent
Tecle

(10) Patent No.: US 6,372,077 B1
(45) Date of Patent: Apr. 16, 2002

(54) METHOD FOR ISOLATING ULTRAFINE AND FINE PARTICLES AND RESULTING PARTICLES

(76) Inventor: Berhan Tecle, 30 Talley Ct., Wilmington, DE (US) 19802

( * ) Notice: Subject to any disclaimer, the term of this patent is extended or adjusted under 35 U.S.C. 154(b) by 0 days.

(21) Appl. No.: 09/480,990

(22) Filed: Jan. 11, 2000

Related U.S. Application Data

(62) Division of application No. 08/962,652, filed on Nov. 3, 1997, now Pat. No. 6,190,731, which is a division of application No. 08/614,020, filed on Mar. 12, 1996, now Pat. No. 5,922,403.

(51) Int. Cl.[7] .............................. B32B 31/12; B05D 1/12
(52) U.S. Cl. ........................ 156/279; 156/283; 427/180
(58) Field of Search ................................ 156/279, 276, 156/283; 427/213.3, 213.31, 213.34, 216, 220, 180

(56) References Cited

U.S. PATENT DOCUMENTS

| | | | |
|---|---|---|---|
| 3,666,678 A | | 5/1972 | Mosier et al. |
| 3,676,363 A | | 7/1972 | Mosier |
| 3,904,562 A | * | 9/1975 | Hopfenberg et al. |
| 3,993,831 A | | 11/1976 | Vassiliades |
| 4,077,804 A | | 3/1978 | Vanzo |
| 4,146,676 A | * | 3/1979 | Saeman et al. |
| 4,186,244 A | | 1/1980 | Deffeyes et al. |
| 4,241,163 A | * | 12/1980 | Myers, Jr. et al. |
| 4,277,364 A | | 7/1981 | Shasha et al. |
| 4,309,214 A | | 1/1982 | Foulard et al. |
| 4,309,374 A | | 1/1982 | Pollard |
| 4,419,383 A | | 12/1983 | Lee |
| 4,428,983 A | | 1/1984 | Nehen et al. |
| 4,435,342 A | | 3/1984 | Wentzell |
| 4,452,861 A | * | 6/1984 | Okamoto et al. |
| 4,521,244 A | | 6/1985 | Goursat et al. |
| 4,619,691 A | | 10/1986 | Araya et al. |
| 4,665,107 A | | 5/1987 | Micale |
| 4,732,369 A | | 3/1988 | Araya et al. |
| 4,758,267 A | | 7/1988 | Webb |
| 4,792,347 A | * | 12/1988 | Deneka et al. |
| 4,812,166 A | | 3/1989 | Saiki et al. |
| 4,822,535 A | | 4/1989 | Ekman et al. |
| 4,829,102 A | * | 5/1989 | Biale |
| 4,851,318 A | | 7/1989 | Hsieh et al. |
| 4,871,790 A | | 10/1989 | Lamanna et al. |
| 4,872,905 A | | 10/1989 | Bourne et al. |
| 4,877,647 A | | 10/1989 | Klabunde |
| 4,923,518 A | * | 5/1990 | Brand et al. |
| 5,008,234 A | | 4/1991 | Ozin et al. |
| 5,009,965 A | | 4/1991 | Feldstein |
| 5,049,322 A | | 9/1991 | Devissaguet et al. |
| 5,147,841 A | | 9/1992 | Wilcoxon |
| 5,160,452 A | | 11/1992 | Marutsuka et al. |
| 5,171,772 A | * | 12/1992 | Hoy et al. |
| 5,208,132 A | * | 5/1993 | Kamada et al. |
| 5,230,729 A | | 7/1993 | McCandlish et al. |
| 5,234,711 A | | 8/1993 | Kamen et al. |
| 5,248,550 A | * | 9/1993 | Turpin et al. |
| 5,352,269 A | | 10/1994 | McCandlish et al. |
| 5,482,720 A | * | 1/1996 | Murphy et al. |
| 5,498,446 A | | 3/1996 | Axelbaum et al. |
| 5,514,350 A | | 5/1996 | Kear et al. |
| 5,556,583 A | | 9/1996 | Tashiro et al. |
| 5,590,387 A | | 12/1996 | Schmidt et al. |
| 5,851,452 A | | 12/1998 | Mas et al. |
| 6,190,731 B1 | * | 2/2001 | Tecle |

FOREIGN PATENT DOCUMENTS

| | | |
|---|---|---|
| EP | 347114 | 12/1989 |
| EP | 373776 | 6/1990 |
| EP | 650945 | 5/1995 |
| WO | WO 97/38041 | 10/1997 |

OTHER PUBLICATIONS

International Search Report for application PCT/US97/03337 dated Jul. 16, 1997.
J.C.S. Chem. Comm., 1974, "Reaction of Metal Atoms with Solutions; Preparation of Bis(cyclo–octa–1,5–diene)iron(0)," pp. 650–651.
Inorganic Chemistry, vol. 29, No. 5, 1990, "Liquid–Phase Metal Vapor Chemistry: Rotary Reactors and Electron–Beam Evaporation Sources," pp. 1068–1073.
Keisaku Kimura and Shunji Bandow, "The Study of Metal Colloids Produced by Means of Gas Evaporation Technique. I. Preparation Method and Optical Properties in Ethanol," The Chemical Society of Japan, (1983), vol. 56, No. 12, pp. 3578–3584.
Susumu Tohno, Masayuki Itoh, Shigeo Aono, and Hiroshi Takano, "Production of Contact–Free Nanoparticles by Aerosol Process: Dependence of Particle Size on Gas Pressure," Journal of Colloid and Interface Science, (1996) vol. 180, Article No. 0338, pp. 574–577.
Wladyslaw Romanowski, "Highly Dispersed Metals," Ellis Horwood Limited, (1987), Chapter 1, Section 1.1, pp. 11–13.
Jörg Weismüller, Nanocrystalline Materials—An Overview, "Synthesis and Processing of Nanocrystalline Powder," David L. Bourell, Ed. Symposium held at the Annual Meeting of The Minerals, Metals & Materials Society on Feb. 4–8, 1996, pp. 3–19.

* cited by examiner

*Primary Examiner*—Curtis Mayes
(74) *Attorney, Agent, or Firm*—Finnegan, Henderson, Farabow, Garrett & Dunner, L.L.P.

(57) ABSTRACT

A method of making isolated particles including the step of at least substantially encapsulating particles present in a highly dispersed colloidal suspension with an encapsulant material, such that the encapsulated particles remain independent and discrete upon separation from the suspension. Also, independent and discrete particles at least substantially encapsulated with the encapsulant material.

27 Claims, No Drawings

METHOD FOR ISOLATING ULTRAFINE AND FINE PARTICLES AND RESULTING PARTICLES

This is a continuation of application Ser. No. 08/962,652, filed Nov. 3, 1997 now U.S. Pat. No. 6,190,731, which is a division of application Ser. No. 08/614,020, filed Mar. 12, 1996, now U.S. Pat. No. 5,922,403.

BACKGROUND OF THE INVENTION

1. Field of the Invention

The present invention is directed to ultrafine and fine particles and methods for making and isolating such particles.

2. Discussion of the Related Art

Ultrafine particles are defined in the art as having diameters of about 100 nm or less. Such particles are therefore smaller than conventional powders, but larger than typical atom clusters. Ultrafine particles are of great interest due to their numerous applications, including use in the formation of ceramic and metal structures, conductive paths and/or conductive layers in electronic devices and the production of catalysts. For example, the use of ultrafine particles in forming ceramic and metal parts results in small grain size., thus providing the parts with optimal physical properties (e.g., strength and ductility). Also, in electronic devices, the small particles allow creation of finer conductor paths. Variations in processes used to produce ultrafine particles may also produce larger, so-called "fine" particles, which are defined as particles having diameters greater than 100 nm but less than 1500 nm. For many of the applications in which ultrafine particles are desired, fine particles may be equally useful.

It has been difficult, however, to obtain powder of ultrafine and fine particles without experiencing agglomeration into larger, less useful particles. Thus, those skilled in the art have attempted to isolate ultrafine and fine particles in a liquid suspension to prevent such agglomeration.

For example, U.S. Pat. No. 4,872,905 discusses a method of obtaining particles by utilizing a sputtering process and a liquid substrate. The metal particles generated from the target electrode encounter vapors of a heated liquid oil, are covered by the oil vapors, and are then captured by the liquid oil. A complex recovery process is required to obtain a usable end product. In particular, the liquid must be mixed with two solvents, such as kerosene and acetone, to thin out the oil and form a colloidal suspension. The acetone (or comparable solvent having a boiling point lower than both the other solvent and the oil) is removed by heating the solution, and the oil-covered particles then settle in the solution. This separation process may have to be performed up to four times. Moreover, prior to using the particles, the oil covering must be removed, for example by washing the particles in a solvent such as dioxane. Once the oil is dissolved, the particles will tend to agglomerate. Thus, while the method of this patent may offer a way of storing ultrafine or fine particles without agglomeration, it does not provide a means for producing isolated particles in a state that facilitates the actual use of the particles.

Another patent dealing with ultrafine and fine particles, U.S. Pat. No. 4,877,647, describes a method for obtaining a colloidal suspension of metal particles. Vaporized metal in a vacuum is captured by a solvent, which may be present as a gas or liquid. Typically, an external cooling set-up is provided, by which the solvent containing the captured metal atoms and atom clusters can be frozen to the interior of the vaporization vessel. The frozen matrix is slowly heated in the vessel to form a colloidal suspension of metal particles in the solvent. A large excess of solvent is required to obtain the suspension, however, at least 30 to 1000 parts by weight of solvent. Preferred metal loadings range from 0.02 to 0.09 molar. Above this level, the metal particles will tend to agglomerate and precipitate. Thus, ultrafine and fine particles produced according to U.S. Pat. No. 4,877,647 are difficult to utilize in many applications, because they cannot be used separately and distinctly from the large amount of solvent required. Moreover, reduction of the amount of solvent results in undesirable agglomeration, thereby destroying the particles usefulness.

The need therefore exists for methods of producing ultrafine and fine particles that remain isolated from one another, yet are in a state that facilitates handling and maximizes potential applications.

SUMMARY OF THE INVENTION

The present invention is directed to a method for isolating particles. The method involves the step of at least substantially encapsulating particles present as a highly dispersed colloidal suspension with an encapsulant material, such that the encapsulated particles remain independent and discrete upon separation from the suspension.

The present invention is also directed to a method for isolating ultrafine particles, including the steps of preparing a highly dispersed colloidal suspension of ultrafine particles of at least one metal in an organic solvent, adding to the suspension an encapsulant material such that the ultrafine particles are substantially encapsulated by the encapsulant material, and separating the encapsulated particles from the suspension.

The present invention is further directed to independent and discrete ultrafine and fine particles at least substantially encapsulated with an encapsulant material, wherein the encapsulant material is at least one compound selected from an amine, an ether, a thiol, a sulfide, a carboxylic acid, a hydroxy acid, a sulfonic acid, a polyhydroxy alcohol, an organosilane, a titanate, a zirconate, a zircoaluminate, a carboxylate, a sulfate, a sulfonate, an ammonium salt, a pyrrole, a furan, a thiophene, an imidazole, an oxazole, a thiazole, a pyrazole, a pyrroline, a pyrrolidine, a pyridine, a pyrimidine, a purine, a triazole, a triazine, and derivatives thereof, such that the particles remain independent and distinct.

It is to be understood that both the foregoing general description and the following detailed description are exemplary, and are intended to provide further explanation of the invention as claimed.

DETAILED DESCRIPTION OF THE INVENTION

The method of the present invention is applicable to particles of metal elements, nonmetal elements, inorganic compounds, and organic compounds, these particles capable of forming a highly dispersed colloidal suspension.

Solid elements such as boron, carbon, silicon and the Main Group metals, such as aluminum, beryllium, magnesium, etc., which are capable of forming atomic and cluster species in the gas phase, can form particles in a controlled fashion in a suitable medium to form colloidal suspensions.

Inorganic solid compounds, such as metal oxides, sulfides, selenides, tellurides, phosphides, antimonides, fluorides and other halide derivatives are known to form colloidal particles in suitable medium. Similarly, other inorganic compounds such as borides, carbides, nitrides and suicides form ultrafine: a particles in a controlled manner. Binary, ternary, and quaternary metal alloys, and the like, and intermetallic compounds can also form ultrafine particles using appropriate methods and conditions. Both organic and inorganic pigments, which may be produced by a variety of methods, require a great deal of physical and innovative effort to keep them well dispersed in a medium and produce them in a desired particle size and size distribution. The ability to keep such materials as discrete particles therefore enhances the efficiency of their production methods and improves their functional properties.

The initial step in producing isolated metal particles according to one embodiment of the present invention is formation of a highly dispersed colloidal suspension of metal particles in an organic solvent. One way to prepare such a suspension is described in U.S. Pat. No. 4,877,647, the entire disclosure of which is incorporated by reference herein.

The suspension may be prepared by first vaporizing a metal or metals to obtain metal atoms and atom clusters. The metal or metals preferably have an atomic number from 21 to 32, 39 to 50 and/or 72 to 82. The metal atoms and atom clusters are captured in a vaporized state in an organic solvent vapor. The atom- and atom cluster-containing solvent vapor is frozen or substantially frozen to form a matrix. The matrix is gradually warmed to room temperature without precipitating the captured metal atoms and atom clusters.

While all the metals listed above may be used, preferred metals for forming ultrafine particles are cobalt, nickel, copper, palladium, silver, platinum, gold, tin, lead, and mixtures thereof.

In such a method, the metal or metals are preferably evaporated under a vacuum with the resultant metal atoms and atom clusters condensed simultaneously with an organic solvent in vapor or liquid form to produce a frozen or substantially frozen matrix. A vacuum below $10^{-2}$ torr, preferably below $10^{-4}$ torr, may be employed. Because an extremely cold surface is necessary to condense and freeze the metal atoms and metal clusters and the solvent to form a solid matrix, liquid nitrogen cooling may be used to freeze the matrix onto the interior of the evacuated chamber. It is preferred that the matrix of the metal atoms and atom clusters and solvent vapors be completely frozen, because a process involving a frozen or solid matrix is easier to control and will produce better results than a process involving a partially frozen matrix.

The solid matrix is preferably allowed to warm up slowly to room temperature, e.g., in a time period from one to four hours, to obtain the suspension. Alternatively, additional solvent that has been cooled to within about 15° C. of its freezing point may be added to the frozen matrix, or the frozen matrix may be transferred to a vessel containing similarly cooled solvent. During such a transfer of the frozen matrix, or addition of solvent, it is preferable to keep the solvent vigorously agitated. This agitation speeds up the warming of the frozen matrix and helps to control the atom clustering process, thereby allowing attainment of particles of the desired size. This agitation also minimizes the amount of solvent required.

A preferred apparatus for preparing the suspension includes a rotary or static reactor assembly connected to a vacuum pump. The reactor assembly may consist of a flask equipped with a resistance heating source to vaporize the metal or metals being used. An electron gun, or the like, may be used instead of a resistance heating source. In addition, the reactor assembly may be equipped with one or more vaporizing sources. An inlet may be provided to introduce the solvent into the flask, preferably directing the solvent toward the flask walls to promote formation of the matrix. An external cooling set-up is preferably provided to condense and freeze the evaporated metal and the solvent on the flask walls.

At extremely low loadings of metal in the solvent, the metal is present as zero-valent solvated atoms or small atom clusters. The salvation phenomenon is characterized by a strong interaction between the atoms or atom clusters with the solvent, resulting in the shifting of electrons from the metal to the solvent molecules or vice versa. This shifting of electrons creates localized charges which provide charge stabilization to the suspension.

At higher loadings, the short-lived solvated metal atoms or atom clusters seek thermodynamic equilibrium by forming larger clusters, thus minimizing the free energy of interfaces. This leads to the formation of ultrafine or fine particles, depending on the amount of clustering. This phenomenon is highly controllable with the proper selection of metal-solvent combinations, solvent flow rate, concentration, temperature, and evaporation rate of the metal. Selection of these variables will optimally result in the formation of particles of the desired size. Particles produced by this method exist as highly dispersed colloidal suspensions characterized by high stability. A "stable" colloidal suspension is defined as a dispersion of colloidal particles that remain evenly distributed throughout the medium for several days, weeks or months without settling, agglomeration, or any change in the size of the discrete particles. The solvent prevents the metal particles from interacting or associating with each other, and for some solvent-metal pairs the suspension may remain stable indefinitely at ambient conditions.

The term "solvent" as used herein encompasses organic liquids which are commonly referred to in the art as solvents, and which are able to form the colloidal suspensions discussed above. Polar organic solvents are preferred due to their greater ability to complex or solvate metal atoms and ago clusters in comparison to non-polar solvents, but any solvent which forms the desired colloidal suspension is suitable. Preferred dielectric constants for the solvent range from about 10 to about 55. Suitable solvents include ketones, alcohols, ethers and the like. Examples include, but are not limited to, acetone, methyl ethyl ketone, ethanol, propanol, dimethylformamide, triethylamine, benzaldehyde, acetaldehyde, tetrahydrofuran, dimethyl sulfoxide, and the like. Preferred solvents are acetone, tetrahydrofuran, methanol, ethanol, 1-propanol, 2-propanol, and the like. In the case of metal atoms, the solvent should be substantially non-reactive with the atoms at the conditions of the condensation in the reactor chamber, i.e., within 25° C. of the solvent's freezing point.

Similar methods for producing a colloidal suspension of metal particles in a solvent from vaporized atoms and atom clusters of metal are equally suitable for use in the present invention, as are all methods of forming suspensions of particles of non-metal elements, organic compounds, and inorganic compounds. Examples of such suspensions include, but are not limited to, hydrosols, organosols, and aerosols.

Common to all such methods of forming colloidal suspensions, however, is the need for a large excess of solvent, particularly in hydrosol and organosol systems, relative to the amount of recoverable and usable particles. The large amount of solvent required is problematic, in that it limits the usefulness of the particles for practical applications.

According to the present invention, an encapsulant material is added to a highly dispersed colloidal suspension of particles and substantially encapsulates the particles by forming an ionic or covalent bond with the particles, or by adsorbing onto the particles' surfaces. The term "encapsulate," as used herein, means the thermodynamically driven process in which the molecules of the encapsulant material coat or cover the particles, i.e., the molecules of encapsulant material at least partially cover the particles or take the form of a monolayer coating or sheath around the particles. Preferably, the entire surface of a particle is encapsulated. Optimally, the coating effectively prevents direct particle-particle interaction, thus preventing agglomeration of the particles. Instances of (a) adsorption of a single molecule of encapsulant material by two or more particles, and (b) weak interaction between adsorbed encapsulant material on separate particles, result in a weak connection between a majority of the encapsulated particles. The resulting interaction creates an open three dimensional network, and, as the networks of encapsulated particles grow, the networked particles begin to flocculate. The particles, however, due to the encapsulation, remain independent and discrete throughout this flocculating process. Preferably, the flocculent settles out of the suspension, thereby easing the recovery of the material. After settling out of the suspension, the material is easily re-dispersed by simple agitation. Upon separation from the suspension, the particles remain encapsulated as discrete entities at ambient conditions, but become available in a more concentrated and useful form.

The encapsulant material may be one or more compounds selected from an amine, an ether, a thiol, a sulfide, a carboxylic acid, a hydroxy acid, a sulfonic acid, a polyhydroxy alcohol, an organosilane, a titanate, a zirconate, a zircoaluminate, a carboxylate, a sulfate, a sulfonate, an ammonium salt, a pyrrole, a furan, a thiophene, an imidazole, an oxazole, a thiazole, a pyrazole, a pyrroline, a pyrrolidine, a pyridine, a pyrimidine, a purine, a triazole, a triazine, and derivatives of any of these compounds. Of these materials, an amine, an ether, a thiol, a sulfide, a carboxylic acid, a hydroxy acid, a sulfonic acid, a polyhydroxy alcohol, or derivatives thereof are preferred for metal particles; an organosilane, a titanate, a zirconate, a zircoaluminate, a carboxylate, a sulfate, a sulfonate, an ammonium salt, or derivatives thereof are preferred for non-metal particles; and a pyrrole, a furan, a thiophene, an imidazole, an oxazole, a thiazole, a pyrazole, a pyrroline, a pyrrolidine, a pyridine, a pyrimidine, a purine, a triazole, a triazine, or derivatives thereof are suitable for metals and some non-metals, but are preferred for metals. An appropriate encapsulant material may be chosen by one skilled in the art based on the characteristics of the particles and solvent.

Preferred encapsulant materials for metal particles are one or more compounds selected from triethanol amine, ethylenediamine, oleic acid, malonic acid, hydroxyacetic acid, dimethyl sulfoxide, propylene glycol, hexanetriol, dioxane, diethylene glycol dimethyl ether, dimethylformamide, 1-(2-cyanoethyl)pyrrole, 3-(2-furyl) acrylonitrile, 3-thiophenemalonic acid, mercaptobenzimidazole, 2-mercaptobenzoxazole, 6-aminobenzothiazole, 3-(2-aminoethyl)pyrazole, 1-pyrrolidinebutyronitrile, 3-pyridineacrylic acid, 4,6-dihydroxypyrimidine, 6-mercaptopurine, 1-chlorobenzotriazole, 2,4,6-triallyloxy-1,3,5-triazine, and derivatives thereof. Particularly preferred compounds for metal particles are malonic acid, oleic acid, 1,2,6-hexanetriol, and triethanolamine.

Monolayer forming compounds known as self-assembled monolayers, such as alkanethiols, dialkyl sulfides, dialkyl disulfides, alcohols, amines, and carboxylic acids are useful encapsulant materials for both metal and non-metal particles. Preferred compounds of this group are undecanethiol and diundecyl disulfide.

Encapsulants for non-metal particles with hydroxylated surfaces, such as silica, silicon, alumina, and the like, include coupling agents such as organosilanes, titanates, zirconates, and zircoaluminates. Preferred encapsulants of this type are trimethylethoxysilane, isopropyltriisostearoyltitanate, and neoalkoxytrisneodecanoylzirconate.

Encapsulants of the amphipathic type, for example, surface active agents such as carboxylates, sulfates, sulfonates, and ammonium salts are also useful encapsulant materials for non-metals. Preferred amphipathic type encapsulant materials are sodium stearate, sodium cetyl sulfate, sodium diisopropylnapthalene sulfonate, and cetyltrimethylammonium bromide.

The encapsulant material may be mixed with a solvent prior to adding the encapsulant material to the suspension, or, similarly, the encapsulant material can be added to the suspension along with additional solvent.

The amount of the encapsulant material to be added to a certain suspension may be determined by "titrations" of about 4 to 8 aliquot samples of the suspension. To each sample of the suspension, a progressively increasing amount of the encapsulant material, either alone or in solution, is preferably added. After 1 to 6 hours, two layers are formed—a first "sediment" layer containing the isolated encapsulated particles and a second layer ranging from clear to a color near that of the starting suspension. The sample having a clear second layer, yet with the smallest amount of added encapsulant material, is used to determine how much encapsulant material should be added to the suspension. Theoretically, this amount is the minimum amount needed to provide complete surface coverage to all the particles in the suspension. The actual amount required further depends on the total surface area of all the particles present in the suspension and the nature of interaction between the particles and the encapsulant. In some aerosol systems, in situ encapsulation may be difficult to control and may not be fully effective in producing and maintaining discrete particles.

The flocculent containing the isolated encapsulated particles can be separated from the solvent of the suspension by any conventional means, such as decanting the clear solvent layer or separating the lower layer containing the particles using a separatory funnel or similar apparatus. The recovered particles retain the encapsulation, along with a small amount of excess encapsulant material and residual solvent. The recovered particles thus take the form of an "ink." This "ink" constitutes a concentrated, more useful form of ultrafine or fine particles, wherein the individual particles remain independent and discrete. In this "ink" form, the particles remain isolated indefinitely at ambient conditions in sealed containers and may also be handled in the open air. The amount of excess encapsulant material and solvent in the "ink" can be reduced by allowing the solvent to evaporate by blowing with a stream of nitrogen gas, or by other means known in the art.

In addition to providing a more concentrated and useful form of isolated ultrafine particles, the present invention also results in particles having a narrow particle size distribution. This is due to the controlled atom clustering and nucleation process involved, as well as the phenomenon wherein the solvated metal atoms or atom clusters seek thermodynamic equilibrium by forming larger clusters to minimize the free energy of interfaces. Stability is also imparted by the encapsulation, which minimizes particle-particle interaction, and thus agglomeration. Typically, ultrafine particles formed according to the present invention will have an average diameter ranging from 20 nm to 70 nm, depending on the particular metal or metals used and the conditions employed. Larger, "fine" particles produced by adjustment of the process conditions will typically have diameters ranging from 100 nm to 1500 nm.

The concentrated, encapsulated, and isolated particles made according to the present invention may be used for a variety of applications. When using the particles for coating a substrate, additives such as fluxing agents, as well as a variety of surface treatment techniques, may provide enhanced adherence of the coating to the substrate. Suitable substrates include ceramics, metals, glass, polymer films, and various fibers. The particle "ink" may also be used for metal joining applications such as electronic component attachment. When the "ink" is applied in coatings or metal joining, under conventional coating or metal joining conditions, the encapsulant will typically evaporate from the particles or will form a liquid that can be washed off, leaving the ultrafine particles to interact and form a continuous layer or coating. Also, fibers such as, for example, Kevlar®, Nylon®, and natural fibers may be dipped into a metal particle "ink" of the present invention to impart conductivity. In addition a metal particle "ink" may be used to form solder paste and solder ink, or other metal inks. Metal particles of the invention may also be used to obtain a desired grain structure in ceramics, metals, and metal/ceramic composites. Specifically, manipulation of forming and treating conditions, within the knowledge of one skilled in the art, can be used to obtain a variety of grain structures to optimize properties such as strength and ductility. Other uses will be apparent to those skilled in the art.

The invention will be further clarified by the following examples, which are intended to be purely exemplary of the invention. In the examples below, all parts and percentages are by weight unless otherwise indicated. The solvents, except the alcohols, were dried with lithium aluminum hydride (e.g., Baker P403–05). Alcohols with low water content were dried over lithium hydride (Aldrich 20, 104-9). Solvents suspected of containing peroxides such as tetrahydrofuran were first treated with cuprous chloride to remove the peroxide and then dried with lithium aluminum hydride. After drying, the solvents were vacuum distilled and thoroughly degassed and were stored in special solvent vessels.

EXAMPLE 1

Preparation of Metal Particle Suspensions

A reactor assembly consisting of a 3-liter cylindrical heavy-wall reaction flask and a flask head having five openings, with extra-thick finely ground flat flanges, was securely held together with a clamp. The flask was connected to a vacuum system through the middle joint of the three in-line ground glass joints. One ground joint was used to connect a product vessel having a Teflon® needle valve with a capillary rod which was used to recover the colloidal suspension from the bottom of the flask, and the third ground joint was sealed with a penny-head joint. The remaining two openings, one on each side of the ground joints were fitted with o-ring joints. Two electrodes were inserted through these openings and a resistively heated alumina coated tungsten crucible (Sylvania GTE Emissive Products 038314) was attached to the electrodes.

The system, after loading the crucible with the metal to be evaporated, was evacuated until a $1.0 \times 10^{-6}$ torr reading was obtained with an ion gauge. The flask was then immersed in a Dewar containing liquid nitrogen. The reactor and the main manifold was isolated and the solvent vessel opened to transfer solvent in the vapor phase to the reactor. After sufficient solvent had deposited on the walls of the reactor, the crucible was heated to evaporate the metal at a controllable rate, such that there was adequate solvent matrix for the metal vapor. The metal vapor made up of metal atoms and small atom clusters was captured in the matrix in this form. After enough metal was evaporated, the reactor was isolated and the frozen matrix allowed to slowly warm up by allowing the liquid nitrogen in the Dewar to evaporate over approximately two hours. During the warm up, particles began to form from the atoms and atom clusters, and the resultant product was a stable, highly dispersed, colloidal suspension. The suspension was transferred through the capillary rod to the product vessel, which had been evacuated with the reactor and was kept isolated at $1.0 \times 10^{-6}$ torr during the vaporization of the metal. Before the needle valve was opened, the reactor was filled with dry argon (0.5 ppm of water and less than 0.2 ppm of oxygen).

A series of experiments using lead, tin, and copper metals in tetrahydrofuran solvents were performed. Particle size measurement was performed using a Malvern 4700 V4 particle size analyzer by photon correlation spectroscopy. The results of these experiments are summarized in Table 1.

TABLE 1

| Run | Metal | Solvent | Particle Size (nm) |
|---|---|---|---|
| 1 | lead | tetrahydrofuran | 122 |
| 2 | " | " | 111 |
| 3 | " | " | 108 |
| 4 | " | " | 276 |
| 5 | " | " | 491 |
| 6 | " | " | 546 |
| 7 | " | " | 193 |
| 8 | " | " | 186 |
| 9 | " | " | 53 |
| 10 | " | " | 61 |
| 11 | " | " | 76 |
| 12 | tin | tetrahydrofuran | 125 |
| 13 | " | " | 63 |
| 14 | " | " | 56 |
| 15 | " | " | 23 |
| 16 | " | " | 53 |
| 17 | " | " | 25 |
| 18 | " | " | 17 |
| 19 | copper | tetrahydrofuran | 223 |
| 20 | " | " | 254 |
| 21 | " | " | 108 |
| 22 | " | " | 98 |
| 23 | " | " | 111 |
| 24 | " | " | 236 |

By changing the vaporization rate of the metal and keeping the flow rate of the solvent constant, the particle size of the suspension can be controlled. The slightest exposure to even adsorbed water in glassware or trace amounts of oxygen was found to destabilize the suspension.

EXAMPLE 2

Preparation of Metal Particle Suspensions

Again using a rotary reactor, the effect of metal loading in isopropanol solvent for copper, tin, and lead was examined.

In addition, particles of a tin-lead alloy were produced by alternating the vaporization of the two metals from different crucibles. The results are shown in Table 2

TABLE 2

| Run # | Metal | Metal Loading (mg/mL) | Particle Size (nm) |
|---|---|---|---|
| 1 | copper | 6.40 | 464 |
| 2 | copper | 4.10 | 77 |
| 3 | tin | 6.68 | 62 |
| 4 | tin | 1.69 | 712 |
| 5 | lead | 0.44 | 125 |
| 6 | lead | 1.93 | 221 |
| 7 | copper | 21.75 | 252 |
| 8 | tin-lead | 2.76/1.56 | 68 |

EXAMPLES 3, 4 and 5

Preparation of Isolated Particles

The following colloidal suspensions of tin, lead and tin/lead alloy were prepared (suspensions A, B, and C, pespectively), along with a solution of malonic acid in triethanolamine (solution D).

A. Tin particle suspension in isopropanol having particle size of 62 nm.

B. Lead particle suspension in isopropanol having particle size of 221 nm.

C. Tin/lead alloy particle suspension in isopropanol having particle size of 68 nm.

D. In a beaker, 300.00 g of triethanolamine (J. T. Baker 9468-01) and 60.00 g of malonic acid (Aldrich M129-6) were mixed with a Cowles blade for 4 hours at 85–90° C. to dissolve the malonic acid in triethanolamine, thus forming an encapsulant material.

EXAMPLE 3

Six test tubes were transferred into an argon filled dry box (0.5 ppm of water and less than 0.2 ppm of oxygen) and contained the following suspensions and solutions.

A-1. 0.0315 g of solution D in 0.75 mL of isopropanol. (encapsulant material)

B-1. 0.0310 g of solution D in 0.75 mL of isopropanol. (encapsulant material)

C-1. 0.0330 g of triethanolamine in 0.75 mL of isopropanol. (encapsulant material)

D-1. 0.0322 g of triethanolamine in 0.75 mL of isopropanol. (encapsulant material)

E-1. 0.0074 g of malonic acid in 0.75 mL of isopropanol. (encapsulant material)

F-1. 0.0071 g of malonic acid in 0.75 mL of isopropanol. (encapsulant material)

In three culture tubes, the following samples were prepared by mixing amounts from the above samples:

A-2. To 5.0 mL of suspension C was added encapsulant material C-1.

B-2. To 5.0 mL of suspension C was added encapsulant material E-1.

C-2. To 5.0 mL of suspension C was added 50 µL of oleic acid in 750 µL of isopropanol.

The contents of samples A-2, B-2, and C-2 were mixed thoroughly by shaking the capped culture tubes. The suspensions became cloudier. The degree of cloudiness was: A-2>B-2>C-2. This indicated that triethanolamine has a greater ability to encapsulate and flocculate the particles in suspension than malonic acid, and that malonic acid has a greater ability to encapsulate and flocculate than oleic acid.

In an identical manner, when the contents of A-1, D-1, and F-1 were added to 5.00 mL of suspension C, the sample containing D-1 formed larger particles which eventually became large clumps, while the other samples become cloudy. Although A-1 contained triethanolamine along with malonic acid, the amount of triethanolamine was critical in encapsulating the particles. These results suggested that the amount of encapsulant material to be added should be determined by titrating aliquot samples.

EXAMPLE 4

The following encapsulant solutions were prepared in a argon-filled dry box.

A-3. 6.8 mg of malonic acid in 0.75 mL of isopropanol

B-3. 30 µL of oleic acid in 0.75 mL of isopropanol

C-3. 35.0 mg of triethanolamine in 0.75 mL of isopropanol

D-3. 30 µL of 1,2,6-hexanetriol (distilled and degassed) in 0.75 mL of isopropanol 2.00 mL of suspension C was transferred into each of 5 small polyethylene bulbs. To four of the polyethylene bulbs 300 µL of solution of A-3, B-3, C-3 and D-3 was added at a rate of 20 µL at intervals of 1.5 seconds while the suspension was stirred using a magnetic stirrer and Teflone stir bar. The fifth polyethylene bulb was used as a control.

One drop was taken from each of the five bulbs, added to 2.00 mL of isopropanol in particle size analysis test tubes, and the resultant solution mixed well to prepare for particle size analysis to determine the effect of adding the encapsulant to the suspension. The results are presented in Table 3.

The interaction between encapsulated particles caused bridging flocculation, i.e., flocculation of more than one encapsulated particle, which resulted in an apparent particle size larger than the control sample. Thus, the measured particle size was actually the average size of flocculated particles (flocs). This was reflected by the fact that the apparent large sizes are multiples of the particle size obtained for the control. The multimodal distribution in these samples also provided further confirmation of this conclusion. Both 1,2,6-hexanetriol and oleic acid were shown to be good encapsulants but relatively weak flocculating agents. Malonic acid and triethanolamine were shown to be good encapsulants as well as strong flocculants.

TABLE 3

| Samples | Particle Size (nm) |
|---|---|
| Control | 68 |
| D-3 encapsulant | 67 |
| B-3 encapsulant | 68 |
| A-3 encapsulant | 129 |
| C-3 encapsulant | 680 |

EXAMPLE 5

In a 250 mL plastic beaker, 118 mL of suspension A and 58 mL of suspension B were combined in an argon-filled dry box. The suspension was mixed using a Teflone stir bar and magnetic stirrer. Approximately 5 mL of this suspension was withdrawn to dissolve 1.2 mL of 1,2,6-hexanetriol (distilled, degassed) (encapsulant material) and the solution was returned to the beaker.

A solution was prepared by dissolving 0.50 mL of encapsulant material D in 7.50 mL of isopropanol. After the contents of the 250 mL beaker above had been stirred for 30 minutes, 4.00 mL of the solution containing material D and isopropanol was added to the beaker gradually while stirring. After 10 minutes, the suspension started to flocculate. The beaker was covered with Parafilm® and left in the dry box overnight undisturbed. Two layers—a clear solvent layer and a dark fluffy layer at the bottom of the beaker—were formed. The clear supernatant was separated, leaving about a 2 mm thick layer. Upon removal from the dry box, the wet Teflon® stir bar was removed from the beaker. As the Teflone stir bar dried. a thick metallic film began to form on it. The recovered material from the dark fluffy layer, resembling a dark "ink," contained the encapsulated metal particles and could be handled at ambient conditions in a variety of applications.

EXAMPLE 6
Preparation and Application of Isolated Particles

An "ink" of the concentrated, isolated particles of the present invention was prepared for use in coating copper pads and as a metal ink.

A suspension of tin/lead particles in isopropanol was prepared using a rotary reactor equipped with resistance heating sources. The particles in the suspension were 68 nm in diameter as determined by photon correlation spectroscopy from five replicate samples. Metal loading in the suspension was 2.76 mg/mL of tin and 1.56 mg/mL of lead.

A solution of 65 mL of 25% 1,2,6-hexanetriol in isopropanol was slowly added to 325 mL of the suspension while stirring with a magnetic stirring bar in an argon-filled dry box. A 0.5% solution of triethanolamine and malonic acid (5:1 ratio), as an encapsulant material, in isopropanol was added at a rate of 50 µL/s for a total volume of 6.5 mL. This addition induced encapsulation of the metal particles, gradual flocculation, and settling. Eventually, the supernatant became clear and the wet sediment, constituting the isolated encapsulated particles, was recovered by decanting the clear supernatant.

About a third of the sediment containing the encapsulated particles was removed from the dry box. A volume of 6.75 mL of absolute methanol, saturated with tin (II) fluoride was added to the sediment and stirred. Excess solvent was allowed to evaporate at ambient condition. The material dried to a crust.

Five drops of glycerol were added to the dried sediment and the sediment was mixed with the tip of a spatula. The mixture turned fluid and was washed with absolute methanol to concentrate it. Excess solvent was allowed to evaporate until the mixture became nearly dry. A small amount of the material was mixed with triethanolamine/malonic acid (5:1 ratio) until good reflow was achieved. Using an automatic liquid dispenser, dots were deposited on copper coupons, and turned to a bright metallic deposit when reflowed in an IR oven. Dots placed on pads of a Super Nova surface mount printed circuit board formed flat bright coating with slightly rough metallic deposits. When the pads were coated with the triethanolamine/malonic acid mixture prior the placement of the dots, the deposits became smooth.

Another portion of the recovered isolated encapsulated particles was used as a metal ink. The ink was used to write on a glass slide, and metallic inscription was produced on the glass slide when the ink was heated to 180° C. to drive off the organic material of the ink.

EXAMPLE 7
Application of Isolated Particles

Thick "ink" or paste prepared in the manner described in Example 6 was used to attach electronic components to a surface mount printed circuit board. The amount of triethanolamine/malonic acid was adjusted until reflow tests showed the presence of sufficient amount of the encapsulant material, which functions as a fluxing agent, to attach the electronic components. With an automatic dispenser and paste printing device, dots or pads were printed on the pads of the board. The electronic components were placed with a Quad Pick N Place unit. After IR reflow, all components were attached to the board.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method of coating a fiber, comprising the step of:
    applying to the fiber discrete ultrafine or fine particles that are at least substantially coated with an encapsulant material, wherein the encapsulant material is at least one compound selected from an amine, an ether, a thiol, a sulfide, a hydroxy acid, a sulfonic acid, an organosilane, a titanate, a zirconate, a zircoaluminate, a sulfate, a sulfonate, an ammonium salt, a pyrrole, a furan, a thiophene, an imidazole, an oxazole, a thiazole, a pyrazole, a pyrroline, a pyrrolidine, a pyridine, a pyrimidine, a purine, a triazole, and a triazine.

2. The method of claim 1, wherein the encapsulant material is at least one compound selected from triethanol amine, ethylenediamine, oleic acid, malonic acid, hydroxyacetic acid, dimethyl sulfoxide, propylene glycol, hexanetriol, dioxane, diethylene glycol dimethyl ether, dimethylformamide, 1-(2-cyanoethyl)pyrrole, 3-(2-furyl) acrylonitrile, 3-thiophenemalonic acid, mercaptobenzimidazole, 2-mercaptobenzoxazole, 6-aminobenzothiazole, 3-(2-aminoethyl)pyrazole, 1-pyrrolidinebutyronitrile, 3-pyridineacrylic acid, 4,6-dihydroxypyrimidine, 6-mercaptopurine, 1-chlorobenzotriazole, 2,4,6-triallyloxy-1,3,5-triazine, undecanethiol, diundecyl disulfide, trimethylethoxysilane, isopropyltriisostearoyltitanate, neoalkoxytrisneodecanoylzirconate, sodium stearate, sodium cetyl sulfate, sodium diisopropylnapthalene sulfonate, and cetyltrimethylammonium bromide, and derivatives thereof.

3. The method of claim 1, wherein the particles comprise at least one metal having an atomic number ranging from 21 to 32, 39 to 50 or 72 to 82.

4. The method of claim 1, wherein the encapsulated particles comprise at least one element or compound selected from metal elements, organic or inorganic compounds capable of forming colloidal suspensions of particles, and solid non-metal elements capable of forming colloidal suspensions of particles.

5. The method of claim 1, wherein the encapsulant material is in direct contact with the surface of each ultrafine or fine particle.

6. A method of coating a fiber, comprising the step of:
    applying to the fiber discrete ultrafine or fine particles that are at least substantially coated with an encapsulant material, wherein the encapsulant material is at least one compound selected from an amine, an ether, a thiol, a sulfide, a carboxylic acid, a hydroxy acid, a sulfonic acid, an organosilane, a titanate, a zirconate, a zircoaluminate, a carboxylate, a sulfate, a sulfonate, an ammonium salt, a pyrrole, a furan, a thiophene, an imidazole, an oxazole, a thiazole, a pyrazole, a pyrroline, a pyrrolidine, a pyridine, a pyrimidine, a purine, a triazole, and a triazine;

wherein said ultrafine or fine particles comprise at least one element or compound selected from metal elements, organic or non-oxide inorganic compounds capable of forming colloidal suspensions of particles, and solid non-metal elements capable of forming colloidal suspensions of particles.

7. The method of claim 6, wherein the encapsulant material is at least one compound selected from triethanol amine, ethylenediamine, oleic acid, malonic acid, hydroxyacetic acid, dimethyl sulfoxide, propylene glycol, hexanetriol, dioxane, diethylene glycol dimethyl ether, dimethylformamide, 1-(2-cyanoethyl) pyrrole, 3-(2-furyl) acrylonitrile, 3-thiophenemalonic acid, mercaptobenzimidazole, 2-mercaptobenzoxazole, 6-aminobenzothiazole, 3-(2-aminoethyl) pyrazole, 1-pyrrolidinebutyronitrile, 3-pyridineacrylic acid, 4,6-dihydroxypyrimidine, 6-mercaptopurine, 1-chlorobenzotriazole, 2,4,6-triallyloxy-1,3,5-triazine, undecanethiol, diundecyl disulfide, trimethylethoxysilane, isopropyltriisostearoyltitanate, neoalkoxytrisneodecanoylzirconate, sodium stearate, sodium cetyl sulfate, sodium diisoprophyinapthalene sulfonate, and cetyltrimethylammonium bromide, and derivatives thereof.

8. The method of claim 6, wherein the particles comprise at least one metal having an atomic number ranging from 21 to 32, 39 to 50 or 72 to 82.

9. The method of claim 6, wherein the encapsulant material is in direct contact with the surface of each ultrafine or fine particle.

10. A method of forming a coating on a substrate, comprising the step of:
    applying to the substrate a composition comprising discrete ultrafine or fine particles at least substantially coated with an encapsulant material, wherein the encapsulant material is at least one compound selected from an amine, an ether, a thiol, a sulfide, a hydroxy acid, a sulfonic acid, an organosilane, a titanate, a zirconate, a zircoaluminate, a sulfate, a sulfonate, an ammonium salt, a pyrrole, a furan, a thiophene, an imidazole, an oxazole, a thiazole, a pyrazole, a pyrroline, a pyrrolidine, a pyridine, a pyrimidine, a purine, a triazole, and a triazine.

11. The method of claim 10, wherein the encapsulant material is at least one compound selected from triethanol amine, ethylenediamine, oleic acid, malonic acid, hydroxyacetic acid, dimethyl sulfoxide, propylene glycol, hexanetriol, dioxane, diethylene glycol dimethyl ether, dimethylformamide, 1-(2-cyanoethyl)pyrrole, 3-(2-furyl) acrylonitrile, 3-thiophenemalonic acid, mercaptobenzimidazole, 2-mercaptobenzoxazole, 6-aminobenzothiazole, 3-(2-aminoethyl)pyrazole, 1-pyrrolidinebutyronitrile, 3-pyridineacrylic acid, 4,6-dihydroxypyrimidine, 6-mercaptopurine, 1-chlorobenzotriazole, 2,4,6-triallyloxy-1,3,5-triazine, undecanethiol, diundecyl disulfide, trimethylethoxysilane, isopropyltriisostearoyltitanate, neoalkoxytrisneodecanoylzirconate, sodium stearate, sodium cetyl sulfate, sodium diisopropylnapthalene sulfonate, and cetyltrimethylammonium bromide, and derivatives thereof.

12. A The method of claim 10, wherein the particles comprise at least one metal having an atomic number ranging from 21 to 32, 39 to 50 or 72 to 82.

13. The method of claim 10, wherein the encapsulated particles comprise at least one element or compound selected from metal elements, organic or inorganic compounds capable of forming colloidal suspensions of particles, and solid non-metal elements capable of forming colloidal suspensions of particles.

14. The method of claim 10, wherein the encapsulant material is in direct contact with the surface of each ultrafine or fine particle.

15. A method of forming a coating on a substrate, comprising the step of:
    applying to the substrate a composition comprising discrete ultrafine or fine particles at least substantially coated with an encapsulant material, wherein the encapsulant material is at least one compound selected from an amine, an ether, a thiol, a sulfide, a carboxylic acid, a hydroxy acid, a sulfonic acid, an organosilane, a titanate, a zirconate, a zircoaluminate, a carboxylate, a sulfate, a sulfonate, an ammonium salt, a pyrrole, a furan, a thiophene, an imidazole, an oxazole, a thiazole, a pyrazole, a pyrroline, a pyrrolidine, a pyridine, a pyrimidine, a purine, a triazole, a triazine;

wherein said ultrafine or fine particles comprise at least one element or compound selected from metal elements, organic or non-oxide inorganic compounds capable of forming colloidal suspensions of particles, and solid non-metal elements capable of forming colloidal suspensions of particles.

16. The method of claim 15, wherein the encapsulant material is at least one compound selected from triethanol amine, ethylenediamine, oleic acid, malonic acid, hydroxyacetic acid, dimethyl sulfoxide, propylene glycol, hexanetriol, dioxane, diethylene glycol dimethyl ether, dimethylformamide, 1-(2-cyanoethyl) pyrrole, 3-(2-furyl) acrylonitrile, 3-thiophenemalonic acid, mercaptobenzimidazole, 2-(2-furyl) acrylonitrile, 3-thiophenemalonic acid, mercaptobenzimidazole, 2-mercaptobenzoxazole, 6-aminobenzothiazole, 3-pyidineacrylic acid, 4,6-dihydroxypyrimidine, 6-mercaptopurine, 1-chlorobenzotriazole, 2,4,6-triallyloxy-1,3,5-triazine, undecanethiol, diundecyl disulfide, trimethylethoxysilane, isopropyltriisostearoyltitanate, neoalkoxytrisneodecanoylzirconate, sodium stearate, sodium cetylcytrimethylammonium bromide, and derivatives thereof.

17. The method of claim 15, wherein the particles comprise at least one metal having an atomic number ranging from 21 to 32, 39 to 50 or 72 to 82.

18. The method of claim 15, wherein the encapsulant material is in direct contact with the surface of each ultrafine or fine particle.

19. A method of joining metal to a substrate, comprising the steps of:
    applying to the substrate discrete ultrafine or fine particles at least substantially coated with an encapsulant material, wherein the encapsulant material is at least one compound selected from an amine, an ether, a thiol, a sulfide, a carboxylic acid, a hydroxy acid, a sulfonic acid, a polyhydroxy alcohol, an organosilane, a titanate, a zirconate, a zircoaluminate, a carboxylate, a sulfate, a sulfonate, an ammonium salt, a pyrrole, a furan, a thiophene an imidazole, an oxazole, a thiazole, a pyrazole, a pyrroline, a pyrrolidine, a pyridine, a pyrimidine, a purine, a triazole a triazine, and derivatives thereof; and placing said metal to be joined in contact with the discrete ultrafine or fine particles.

20. The method of claim 19, wherein the encapsulant material is at least one compound selected from triethanol amine, ethylenediamine, oleic acid, malonic acid, hydroxyacetic acid, dimethyl sulfoxide, propylene glycol, hexanetriol, dioxane, diethylene glycol dimethyl ether, dimethylformamide, 1-(2-cyanoethyl)pyrrole, 3-(2-furyl)acrylonitrile, 3-thiophenemalonic acid, mercaptobenzimidazole, 2-mercaptobenzoxazole, 6-aminobenzothiazole, 3-(2-aminoethyl)pyrazole, 1-pyrrolidinebutyronitrile, 3-pyridineacrylic acid, 4,6-dihydroxypyrimidine, 6-mercaptopurine, 1-chlorobenzotriazole, 2,4,6-triallyloxy-1,3,5-triazine, undecanethiol, diundecyl disulfide, trimethylethoxysilane, isopropyltriisostearoyltitanate, neoalkoxytrisneodecanoylzirconate, sodium stearate, sodium cetyl sulfate, sodium diisopropylnapthalene sulfonate, and cetyltrimethylammonium bromide, and derivatives thereof.

21. The method of claim 19, wherein the particles comprise at least one metal having an atomic number ranging from 21 to 32, 39 to 50 or 72 to 82.

22. The method of claim 19, wherein the encapsulated particles comprise at least one element or compound selected from metal elements, organic or inorganic compounds capable of forming colloidal suspensions of particles, and solid non-metal elements capable of forming colloidal suspensions of particles.

23. The method of claim 19, wherein the encapsulant material is in direct contact with the surface of each ultrafine or fine particle.

24. A method of joining metal to a substrate, comprising the steps of applying to the substrate discrete ultrafine or fine particles at least substantially coated with an encapsulant material, wherein the encapsulant material is at least one compound selected from an amine, an ether, a thiol, a sulfide, a carboxylic acid, a hydroxy acid, a sulfonic acid, a polyhydroxy alcohol, an organosilane, a titanate, a zirconate, a zircoaluminate, a carboxylate, a sulfate, a sulfonate, an ammonium salt, a pyrrole, a furan, a thiophene, an imidazole, an oxazole, a thiazole, a pyrazole, a pyrroline, a pyrrolidine, a pyridine, a pyrimidine, a purine, a triazole, a triazine, and derivatives thereof; and placing said metal to be joined in contact with the discrete ultrafine or fine particles, wherein said ultrafine or fine particles comprise at least one element or compound selected from metal elements, organic or non-oxide inorganic compounds capable of forming colloidal suspensions of particles, and solid non-metal elements capable of forming colloidal suspensions of particles.

25. The method of claim 24, wherein the encapsulant material is at least one compound selected from triethanol amine, ethylenediamine, oleic acid, malonic acid, hydroxyacetic acid, dimethyl sulfoxide, propylene glycol, hexanetriol, dioxane, diethylene glycol dimethyl ether, dimethylformamide, 1-(2-cyanoethyl) pyrrole, 3-(2-furyl) acrylonitrile, 3-thiophenemalonic acid, mercaptobenzimidazole, 2-mercaptobenzoxazole, 6-aminobenzothiazole, 3-(2-aminoethyl) pyrazole, 1-pyrrolidinebutyronitrile, 3-pyridineacrylic acid, 4,6-dihydroxypyrimidine, 6-mercaptopurine, 1-chlorobenzotriazole, 2,4,6-triallyloxy-1,3,5-triazine, undecanethiol, diundecyl disulfide, trimethylethoxysilane, isopropyltriisostearoyltitanate, neoalkoxytrisneodecanoylzirconate, sodium stearate, sodium cetyl sulfate, sodium diisoprophylnapthalene sulfonate, and cetyltrimethylammonium bromide, and derivatives thereof.

26. The method of claim 24, wherein the particles comprise at least one metal having an atomic number ranging from 21 to 32, 39 to 50 or 72 to 82.

27. The method of claim 24, wherein the encapsulant material is in direct contact with the surface of each ultrafine or fine particle.

* * * * *

UNITED STATES PATENT AND TRADEMARK OFFICE
CERTIFICATE OF CORRECTION

PATENT NO. : 6,372,077 B1
DATED : April 16, 2002
INVENTOR(S) : Berhan Tecle

It is certified that error appears in the above-identified patent and that said Letters Patent is hereby corrected as shown below:

Column 13,
Line 31, "diisoprophyinapthalene" should read -- diisoprophylnapthalene --.

Column 14,
Line 42, "2-(2-furyl)" should read -- 3-(2-furyl) --.

Signed and Sealed this

Twenty-fourth Day of September, 2002

Attest:

Attesting Officer

JAMES E. ROGAN
Director of the United States Patent and Trademark Office

UNITED STATES PATENT AND TRADEMARK OFFICE
CERTIFICATE OF CORRECTION

PATENT NO.    : 6,372,077 B1                                                   Page 1 of 1
DATED         : April 16, 2002
INVENTOR(S)   : Berhan Tecle It is certified that error appears in the above-identified patent and that said Letters Patent is hereby corrected as shown below:

<u>Column 13,</u>
Line 31, "diisoprophyinapthalene" should read -- diisopropylnapthalene --.

<u>Column 14,</u>
Line 42, "2-(2-furyl)" should read -- 3-(2-furyl) --.

This certificate supersedes Certificate of Correction issued September 24, 2002.

Signed and Sealed this

Fifteenth Day of April, 2003

JAMES E. ROGAN
*Director of the United States Patent and Trademark Office*